United States Patent [19]
Progar

[11] Patent Number: 5,552,781
[45] Date of Patent: Sep. 3, 1996

[54] FAULT TOLERANT METHOD OF DECODING AN ELECTRONIC KEY SYSTEM

[75] Inventor: Paul M. Progar, Plymouth, Mich.

[73] Assignee: Ford Motor Company, Dearborn, Mich.

[21] Appl. No.: 332,189

[22] Filed: Oct. 31, 1994

[51] Int. Cl.$^6$ .................................................. H03K 17/94
[52] U.S. Cl. ........................... 341/22; 341/24; 341/25; 341/26; 364/189; 364/709.12
[58] Field of Search ................................ 341/22, 24, 25, 341/26; 364/189, 709.12; 340/825.79

[56] References Cited

U.S. PATENT DOCUMENTS

| | | | |
|---|---|---|---|
| 3,720,938 | 3/1973 | Leposavic | 341/24 |
| 3,932,838 | 1/1976 | Sitter | 371/59 |
| 4,266,213 | 6/1981 | Renschke | 340/166 R |
| 4,357,849 | 11/1982 | Ezawa et al. | 341/26 |
| 4,583,189 | 4/1986 | Koyama | 364/709.12 |
| 4,617,554 | 10/1986 | Krause et al. | 340/365 E |
| 4,675,653 | 6/1987 | Priestley | 340/365 R |
| 4,918,445 | 4/1990 | Bower | 341/26 |
| 4,922,248 | 8/1990 | Shiga | 341/26 |
| 4,954,823 | 9/1990 | Binstead | 341/26 |
| 4,959,831 | 9/1990 | Wroblewski | 370/112 |
| 5,036,320 | 7/1991 | Wroblewski | 341/26 |
| 5,264,845 | 11/1993 | Kwon et al. | 341/26 |
| 5,457,455 | 10/1995 | Lee | 341/26 |

OTHER PUBLICATIONS

Leonardo Herzenberg and Kent W. Andres, An LSI Approach to Keyboard Encoding, Oct. 1971, pp. 81–87.

*Primary Examiner*—John K. Peng
*Assistant Examiner*—Ashok Mannava
*Attorney, Agent, or Firm*—Mark L. Mollon, Esq.; Roger L. May, Esq.

[57] ABSTRACT

A fault tolerant method of decoding an electronic key system includes the steps of reading a key return image from one or more actuated keys and comparing the read key return image to the previous key return image. The method also includes the steps of determining the actuated key from a net key return image between the read key return image and the previous key return image.

14 Claims, 2 Drawing Sheets

5,552,781

FAULT TOLERANT METHOD OF DECODING AN ELECTRONIC KEY SYSTEM

BACKGROUND OF THE INVENTION

1. Field of the Invention

The present invention relates generally to electronic key systems and, more specifically, to a fault tolerant method of decoding an electronic key system.

2. Description Of the Related Art

It is known to control electronic equipment via an input key system which has a plurality of keys or switches arranged in any number of rows and columns. Such electronic equipment may include, for example, electronic calculators or radio receivers. The keys, when actuated, serve to establish electrical connections between input leads which may be associated with the aforementioned rows and columns and a microprocessor for data-processing information offered via the actuated keys in a binary code.

For a radio receiver in an automotive vehicle, the keys are typically a push-button switch such as, for example, a simple momentary switch acting as an operating contact. Each push-button switch is typically a rubber pad with conductive material to make contact with a printed circuit board. Although this electronic key system has worked well for the radio receiver, it suffers from the disadvantage that the conductive material wears off over time and sticks to the printed circuit board causing a shorted switch contact. Mechanical features such as stuck keys have also caused switch contact shorts. Another disadvantage of this electronic key system is that typical key decoding locks up all keys if any key or keys become shorted.

SUMMARY OF THE INVENTION

Accordingly, the present invention is a fault tolerant method of decoding an electronic key system including the steps of reading a key return image from one or more actuated keys and comparing the read key return image to the previous key return image. The method also includes the step of determining the actuated key from a net key return image between the read key return image and the previous key return image.

One feature of the present invention is that a fault tolerant method is provided for decoding an electronic key system. Another feature of the present invention is that the fault tolerant method provides for decoding an electronic key system for a radio receiver in an automotive vehicle. Yet another feature of the present invention is that the fault tolerant method decodes the electronic key system such that the function of another key may be used if a key becomes shorted.

Other features and advantages of the present invention will be readily appreciated as the same becomes better understood after reading the subsequent description taken in conjunction with the accompanying drawings.

Figure 1:
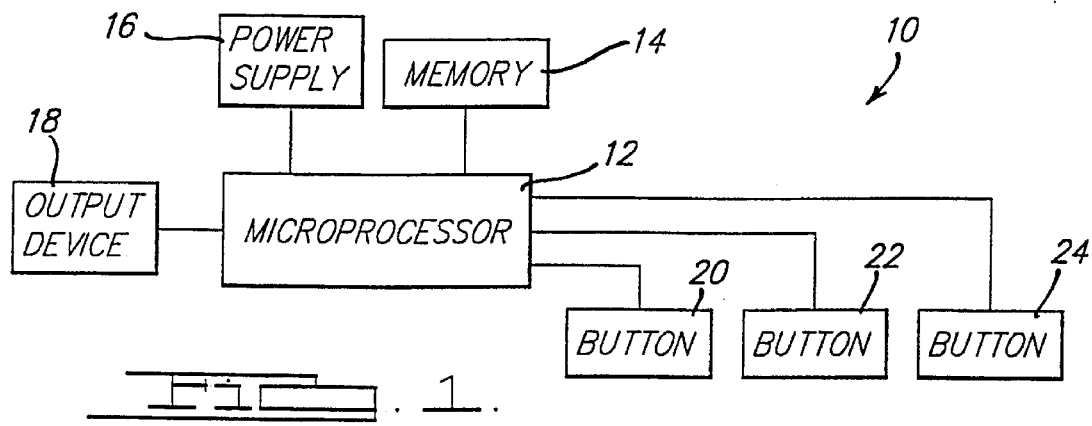
FIG. 1 is a block diagram of an electronic key system.

DESCRIPTION OF TEE PREFERRED EMBODIMENT(S),

Referring to FIG. 1, one embodiment of an electronic key system 10 is shown, for example, a radio receiver (not shown) in a motor vehicle such as an automotive vehicle (not shown). The key system 10 includes a microprocessor 12 and memory 14 connected to the microprocessor 12. The key system 10 also includes a power supply 16 connected to the microprocessor 12 for supplying power thereto and an output device 18 such as a speaker (not shown) connected to the microprocessor 12 for producing an output from the microprocessor 12. The key system 10 further includes a plurality of keys 20, 22, 24 connected to the microprocessor 12 to establish electrical connections between input leads (not shown) and the microprocessor 12 to provide an input thereto as is known in the art. The keys 20, 22, 24 are push-button switches such as momentary switches acting as operating contacts. Each push-button switch produces a key return with a binary code as is known in the art. The key system 10 can have key returns that are active high or low. In this embodiment, the keys 20, 22, 24 are assumed to be active high. As a result, the bits inside the microprocessor 12 reading the key return image should be set to "no active return", e.g. in an eight bit active high system 000 becomes 0000 0000. In this embodiment, the key 20 may act as a power switch and the key 22 may act as a volume-up switch to increase the volume output of the output device 18 and the key 24 may act as a volume-down switch to decrease the volume output of the output device 18. It should be appreciated that the electronic key system 10 is being described for one particular embodiment of a radio receiver in an automotive vehicle although other embodiments may be used. It should also be appreciated that the present fault tolerant key decoding system is dynamic, e.g., any key or keys that become shorted at any time can be overridden by another key at any time. Also, any shorted key or keys that become unshorted are immediately functional as though they were never shorted.

Figure 2A:
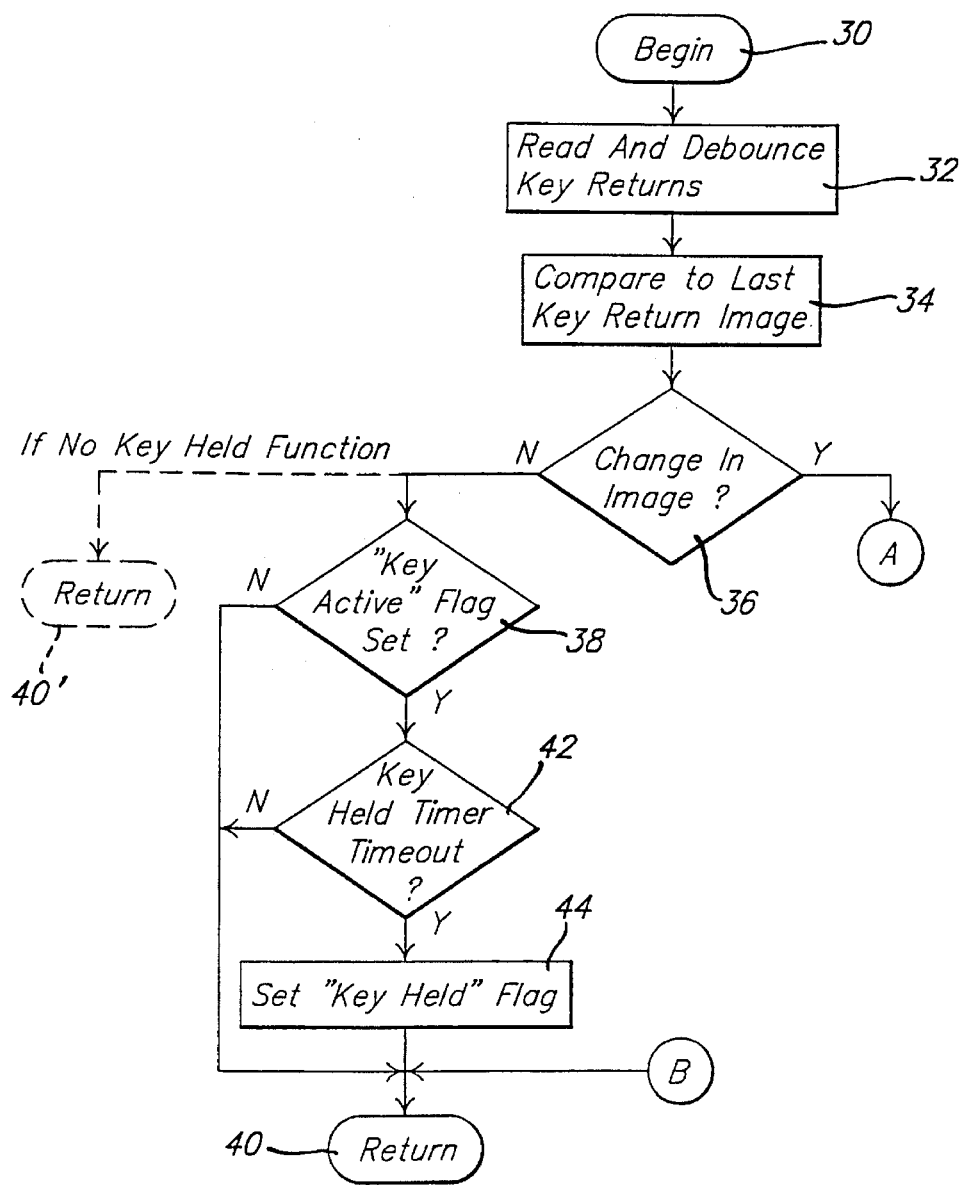
FIG. 2 is a flowchart of a fault tolerant method, according to the present invention, of decoding the electronic key system of FIG. 1.
Figure 2B:
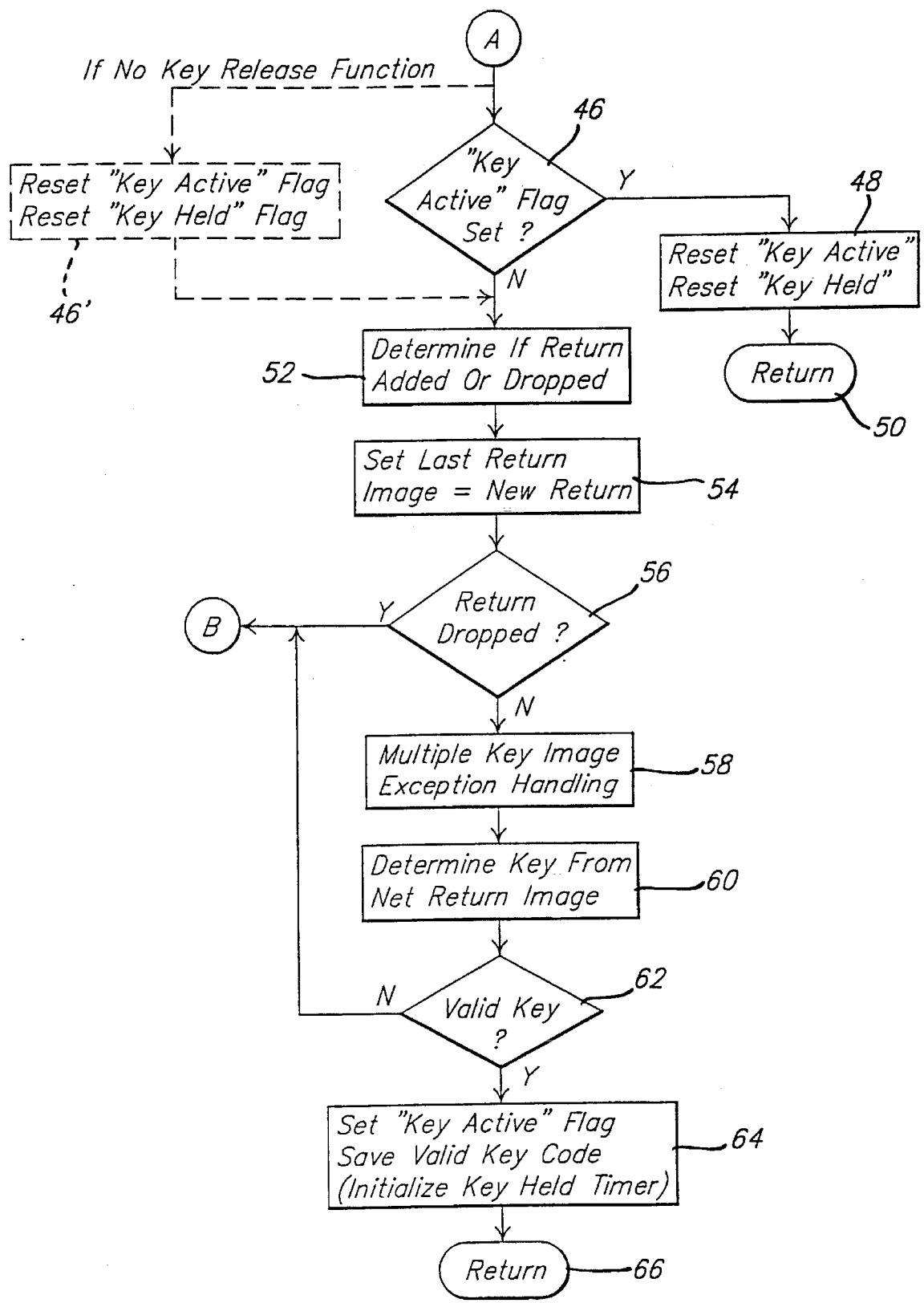

Referring to FIG. 2, one embodiment of a fault tolerant method, according to the present invention, of decoding the electronic key system 10 is shown. The fault tolerant method decodes a valid key code from a key return image. The methodology begins in bubble 30 and advances to block 32. In block 32, the methodology reads and debounces a key return image using any standard debouncing technique to get a new key return image from an actuated key 20,22,24. The microprocessor 12 receives the binary code of the key return image from an actuated key 20,22,24 and stores the key return image in memory 14. The methodology then advances to block 34 and compares the read or new key return image from block 32 to a last or previous key return image stored in memory 14. The microprocessor 12 checks for a net change between the new key return image and the last key return image, for example, by exclusive oring the new and last key return image patterns bit for bit. The microprocessor 12 saves the net change of the key return images in memory 14 for further processing. It should be appreciated that the last key return image is initialized with a value equal to "no active return", in this example, 0000 0000.

After block 34, the methodology advances to diamond 36 and determines whether there is a change or difference in the compared key return images of block 34. The microprocessor 12 retrieves the net key return image stored in memory 14 and, if non-zero, determines that the key return image has changed. For example, the last key return image may be 0000 0001 and the new key return image may be 0000 0101.

Thus, a change in the key return images exists because the net key return image is 0000 0100.

In diamond 36, if there is no change in the key return images, the methodology advances to diamond 38 and determines whether a "key active" flag to be described has been set. The microprocessor 12 looks to see if the key active flag, for example, has been previously set. If the key active flag has not been set, the methodology advances to bubble 40 and returns. It should be appreciated that the key active flag is initially cleared, meaning no key is currently active.

In diamond 38, if the key active flag has been set, the methodology advances to diamond 42 and determines whether a key held timer in the microprocessor 12 has timed out. The microprocessor 12 tracks the amount of time the actuated key 20,22,24 has been actuated or held using a key held timer in memory 14. For example, one half of a second is determined to be a key held. It should be appreciated that the key held timer is an optional feature for the method.

In diamond 42, if the key held timer has not timed out, the methodology advances to bubble 40 and returns. If the key held timer has timed out, the methodology advances to block 44 and sets a "key held" flag, then advances to bubble 40 and returns. It should be appreciated that the key held flag is initially cleared, meaning no key is currently held.

In diamond 36, if there is a change in key return images, the methodology advances to diamond 46 and determines whether the key active flag has been set as previously described for diamond 38. If so, the methodology advances to block 48 where the microprocessor 12 resets or clears the key active and key held flags. After block 48, the methodology advances to bubble 50 and returns.

In diamond 46, if the key active flag has not been set, the methodology advances to block 52 and determines whether the new key return image was added or dropped to determine whether the new key return has become active or inactive, for example, by subtracting the new key return image from the last key return image and using the microprocessor's 12 carry bit as the indicator. For example, if the carry bit is set, a key return has become active and, if the carry bit is clear, a key re, turn has become inactive. As a result, the net key return image of the last key return image and new key return image is as follows:

```
0000  0001  LAST
0000  0101  NEW
1111  1100  NET   =   ADDED
```

The microprocessor 12 remembers the fact that a key return has been added using memory 14 (or the carry bit itself). The methodology then advances to block 54 and sets the last key return image equal to the new key return image. The microprocessor 12 sets the binary code of the last key return image in memory 14 to the binary code of the new key return image. After block 54, the methodology advances to diamond 56 and determines whether the new key return image was dropped as determined in block 52. The microprocessor 12 looks at memory 14 (or the carry bit) to see if it indicates that the new key return image was dropped. If the new key return image was dropped, the methodology advances to bubble 40 and returns. If not, the methodology advances to block 58 and processes multiple key image exception handling. The microprocessor 12 checks the unmasked new key return image for valid multiple key return key codes from a look-up table stored in memory 14. If there is a valid multiple key return key code, the microprocessor 12 overwrites or replaces the net key return image stored in memory 14 with the valid multiple key return key code. It should be appreciated that the multiple key image exception handling is an optional feature.

After block 58 the methodology advances to block 60 and determines the specific key actuated of the keys 20, 22, 24 from the net key, return image. The microprocessor 12 compares the net key return image to, for example, a look-up table stored in memory 14 for a valid key code of the specific key or keys actuated or depressed. For example, 0000 0100 of the net key return image may correspond to the key code of 20 for power of the radio receiver. From block 60, the methodology advances to diamond 62 and determine whether the determined specific key of block 60 is valid. The microprocessor 12 looks at the determined key to see if it has a valid key code for the radio receiver. If not, the methodology advances to bubble 40 and returns. As a result, the microprocessor 12 does not process the determined key of block 60.

In diamond 62, if the determined key is valid, the methodology advances to block 64 and sets a "key active" flag and saves the valid key code in memory for the determined key. If there is a valid key code, the microprocessor 12 sets a "key active" flag indicating there is a new valid key code to be processed. For example, if the determined key is the volume-up key, the microprocessor 12 processes the determined key by increasing the volume of the output device or speaker 18. The methodology then advances to bubble 66 and returns.

As illustrated in FIG. 2, another embodiment of the fault tolerant method may eliminate the use of a key held function as described in diamond 42 and block 44. As a result, if there is no change in key return images in diamond 36, the methodology advances to bubble 40' and returns. Similarly, the method may eliminate the use of a key release function as described in block 48. As a result, if there is a change in key return images in diamond 36, the methodology advances to block 46', resets the key active and key held flags and advances to block 52 previously described.

Accordingly, the fault tolerant method decodes the electronic key system 10. The fault tolerant method decodes a valid key code from a key return image. The fault tolerant method applies to any number of keys greater than one arranged in any number of rows and/or columns. The fault tolerant method is the same whether the active key return state is high or low and acts on the net change in key return activity. As a result, the fault tolerant method allows the function of other keys if a key or keys becomes shorted.

The present invention has been described in an illustrative manner. It is to be understood that the terminology which has been used is intended to be in the nature of words of description rather than of limitation.

Many variations and modifications of the present invention are possible in light of the above teachings. Therefore within the scope of the appended claims, the present invention may be practiced otherwise than as specifically described.

What is claimed is:

1. A fault tolerant method of decoding an electronic key system having a plurality of keys, said method comprising the steps of:

actuating at least one of the keys;

reading multiple bits of a key return code from the at least one key;

comparing the multiple bits of the read key return code to multiple bits of a previous key return code created by one of the keys previously actuated; and determining the at least one key from comparing the multiple bits of the read key return code and the multiple bits of the previous key return code;

determining whether a change exists between the compared key return codes prior to said of determining;

determining whether the key active flag has been set if a change does exist between the compared key return codes; and determining if the key return code was added or subtracted if the key active flag has not been set.

2. A method as set forth in claim 1 including the step of determining whether the at least one key is currently active if a change does not exist between the compared key return codes.

3. A method as set forth in claim 2 including the step of determining whether a key held timer has timed out.

4. A method as set forth in claim 3 including the step of setting a key held flag if the key held timer has timed out.

5. A method as set forth in claim 1 including the step of setting the last key return code to the read key return code.

6. A method as set forth in claim 5 including the step of determining whether the key return code was subtracted.

7. A method as set forth in claim 6 including the step of determining the at least one key actuated from the compared key return codes if the read key return code was added to the previous key return code.

8. A method as set forth in claim 7 including the step of determining whether the at least one key is one of the plurality of keys.

9. A method as set forth in claim 8 including the step of processing the at least one key if the determined key was valid.

10. A fault tolerant method of decoding a valid key code from a key return code in an electronic key system having a plurality of keys for a radio receiver, said method comprising the steps of:

actuating one key of the plurality of keys;

setting a key active flag when the one key is actuated;

reading multiple bits of a key return code from the one key for the radio receiver;

comparing the multiple bits of the read key return code to multiple bits of a previous key return code;

determining whether a change exists between the compared key return codes;

determining whether the key active flag has been set;

processing a held key if a change does not exist and the key active flag has been set;

processing a key release if a change exists and the key active flag has been set; and determining the one key from comparing the multiple bits of the read key return code and the multiple bits of the previous key return code if a change exists and the key active flag has not been set;

processing a held key timer; and determining if the key return code was added or subtracted and the one key is depressed.

11. A method as set forth in claim 10 including the step of setting the key return code to the previous key return code.

12. A method as set forth in claim 11 including the step of determining whether the key return code was subtracted.

13. A method as set forth in claim 12 including the step of determining the one key from comparing all of the key return code and all of the previous key return code if the key return code.

14. A method as set forth in claim 13 including the step of determining whether the one key is one of the plurality of keys.

* * * * *